United States Patent
Hong

(10) Patent No.: US 10,460,809 B2
(45) Date of Patent: Oct. 29, 2019

(54) MEMORY SYSTEM AND OPERATING METHOD THEREOF

(71) Applicant: SK hynix Inc., Gyeonggi-do (KR)

(72) Inventor: Ji-Man Hong, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/132,803

(22) Filed: Sep. 17, 2018

(65) Prior Publication Data

US 2019/0267091 A1  Aug. 29, 2019

(30) Foreign Application Priority Data

Feb. 27, 2018  (KR) .................. 10-2018-0023817

(51) Int. Cl.
| | |
|---|---|
| *G11C 16/04* | (2006.01) |
| *G11C 16/10* | (2006.01) |
| *G11C 11/56* | (2006.01) |
| *G11C 16/34* | (2006.01) |
| *G11C 8/12* | (2006.01) |

(52) U.S. Cl.
CPC ............. *G11C 16/10* (2013.01); *G11C 8/12* (2013.01); *G11C 11/5628* (2013.01); *G11C 16/3431* (2013.01); *G11C 16/3495* (2013.01); *G11C 16/0483* (2013.01)

(58) Field of Classification Search
CPC . G11C 11/5635; G11C 16/08; G11C 16/3427; G11C 2211/5641
See application file for complete search history.

(56) References Cited

U.S. PATENT DOCUMENTS

| | | | | |
|---|---|---|---|---|
| 2010/0002506 | A1* | 1/2010 | Cho ..................... | G11C 11/5628 365/185.03 |
| 2015/0003151 | A1* | 1/2015 | Lee ........................ | G11C 16/10 365/185.02 |
| 2015/0179269 | A1* | 6/2015 | Lee ........................ | G11C 16/14 365/185.03 |
| 2016/0049192 | A1* | 2/2016 | Lee ..................... | G11C 16/3427 365/185.03 |
| 2019/0146871 | A1* | 5/2019 | Jeong .................. | G06F 11/1068 |

FOREIGN PATENT DOCUMENTS

| | | |
|---|---|---|
| KR | 1020130050586 | 5/2013 |
| KR | 1020150039000 | 4/2015 |
| KR | 1020170095524 | 8/2017 |

* cited by examiner

*Primary Examiner* — Tuan T Nguyen
(74) *Attorney, Agent, or Firm* — IP & T Group LLP

(57) ABSTRACT

An operating method of a memory system that includes a plural-level cell memory block capable of storing N-bit data in a single memory cell includes accessing a plural-level cell memory block in an N-bit cell mode, determining a degree of disturbance of the plural-level cell memory block, designating one or more memory cells in an erase state included in an open memory area of the plural-level cell memory block as an M-bit group, where M is an integer smaller than N, according to a result of the determination, and accessing the M-bit group in an M-bit cell mode.

21 Claims, 16 Drawing Sheets

MEMORY SYSTEM AND OPERATING METHOD THEREOF

CROSS-REFERENCE TO RELATED APPLICATIONS

The present application claims priority under 35 U.S.C. § 119(a) to Korean Patent Application No. 10-2018-0023817, filed on Feb. 27, 2018, the disclosure of which is incorporated herein by reference in its entirety.

BACKGROUND

1. Field

Various embodiments of the present invention generally relate to a memory system. Particularly, the embodiments relate to a memory system including a nonvolatile memory device and a controller, and an operating method of the memory system.

2. Description of the Related Art

The computer environment paradigm has been shifting to ubiquitous computing, which enables computer systems to be used anytime and anywhere. As a result, use of portable electronic devices such as mobile phones, digital cameras, and notebook computers has rapidly increased. These portable electronic devices generally use a memory system having one or more memory devices for storing data. A memory system in such device may be used as a main memory device or an auxiliary memory device.

Since they have no moving parts (e.g., a mechanical arm with a read/write head) memory systems may provide excellent stability and durability, high information access speed, and low power consumption. Examples of memory systems having such advantages include universal serial bus (USB) memory devices, memory cards having various interfaces, and solid state drives (SSD).

SUMMARY

Embodiments of the present invention are directed to a memory system that may resume a write operation to avoid, reduce or prevent an undesirable effect caused by erase cell disturbance, and an operating method of the memory system.

In accordance with an embodiment of the present invention, an operating method of a memory system that includes a plural-level cell memory block capable of storing N-bit data in a single memory cell includes: accessing a plural-level cell memory block in a N-bit cell mode; determining a degree of disturbance of the plural-level cell memory block; designating one or more memory cells in an erase state included in an open memory area of the plural-level cell memory block as an M-bit group, where M is an integer smaller than N, according to a result of the determination; and accessing the M-bit group in an M-bit cell mode.

In accordance with an embodiment of the present invention, a memory system includes: a memory device including a plural-level cell memory block capable of storing N-bit data in a single memory cell; and a controller suitable for controlling the memory device, wherein the controller accesses a plural-level cell memory block in a N-bit cell mode, determines a degree of disturbance of the plural-level cell memory block, designates one or more memory cells in an erase state included in an open memory area of the plural-level cell memory block as an M-bit group, where M is an integer smaller than N, according to a result of the determination, and accesses the M-bit group in an M-bit cell mode (hereinafter referred to as an "M-bit cell mode access").

In accordance with an embodiment of the present invention, a memory system, comprising: a memory device including a plurality of plural-level cell memory blocks, each including a plurality of memory cells, each capable of storing N-bit data; and a controller suitable for accessing at least one plural-level cell memory block and monitoring disturbance of accessed plural-level cell memory block, wherein, when the disturbance of the accessed plural-level cell memory block exceeds a threshold value, the controller handles an unprogrammed region of the accessed plural-level cell memory block in a way that one or more memory cells in the unprogrammed region are capable of storing M-bit data, where M is a smaller integer than N.

DETAILED DESCRIPTION

Figure 1:
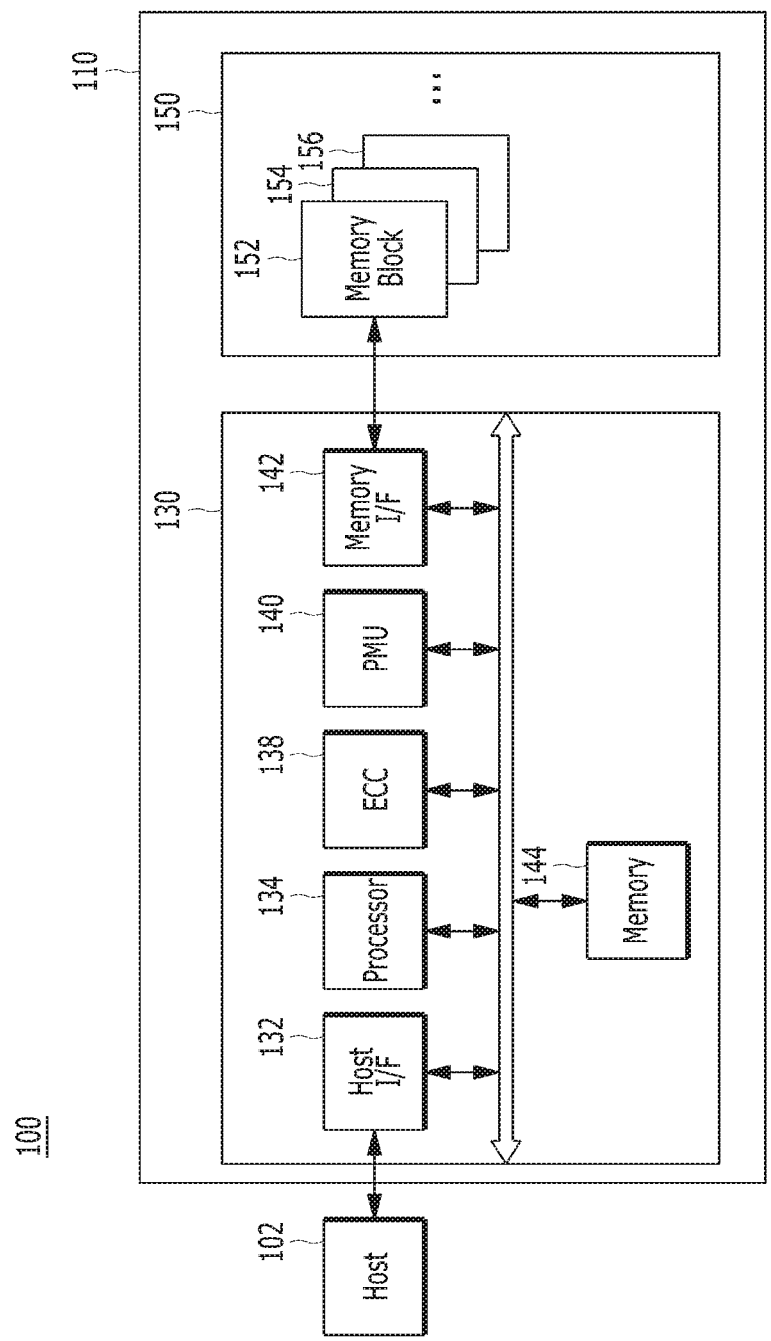
FIG. 1 is a block diagram illustrating a data processing system in accordance with an embodiment of the present invention.

Various embodiments of the present invention are described below in more detail with reference to the accompanying drawings. We note, however, that the present invention may be embodied in different other embodiments, forms and variations thereof and should not be construed as being limited to the embodiments set forth herein. Rather, the described embodiments are provided so that this disclosure will be thorough and complete, and will fully convey the present invention to those skilled in the art to which this invention pertains. Throughout the disclosure, like reference numerals refer to like parts throughout the various figures and embodiments of the present invention. It is noted that reference to "an embodiment" does not necessarily mean only one embodiment, and different references to "an embodiment" are not necessarily to the same embodiment(s).

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated to clearly illustrate features of the embodiments. When an element is referred to as being connected or coupled to another element, it should be understood that the former can be directly connected or coupled to the latter, or electrically connected or coupled to the latter via an intervening element therebetween.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for describing particular embodiments only and is not intended to be limiting of the present invention.

As used herein, singular forms are intended to include the plural forms and vice versa, unless the context clearly indicates otherwise.

It will be further understood that the terms "comprises," "comprising," "includes," and "including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

Hereinafter, the various embodiments of the present invention will be described in detail with reference to the attached drawings.

FIG. 1 is a block diagram illustrating a data processing system 100 in accordance with an embodiment of the present invention.

Referring to FIG. 1, the data processing system 100 may include a host 102 coupled to a memory system 110.

By way of example and not limitation, the host 102 may include any of various portable electronic devices such as a mobile phone, a MP3 player and a laptop computer, or any of various non-portable electronic devices such as a desktop computer, a game machine, a TV, and a projector.

The host 102 may include at least one operating system (OS). The OS may manage and control overall functions and operations of the host 102. The OS may provide operation between the host 102 and a user, which may be achieved or implemented with the data processing system 100 or the memory system 110. The OS may support functions and operations requested by a user. By way of example and not limitation, the OS may be divided into a general OS and a mobile OS, depending on whether it is customized for the mobility of the host 102. The general OS may be divided into a personal OS and an enterprise OS, depending on the environment of a user. For example, the personal OS configured to support a function of providing a service to general users may include Windows and Chrome, and the enterprise OS configured to secure and support high performance may include Windows server, Linux and Unix. Furthermore, the mobile OS configured to support a customized function of providing a mobile service to users and a power saving function of a system may include Android, iOS and Windows Mobile. The host 102 may include a plurality of OSs. The host 102 may execute an OS to perform an operation corresponding to a user's request on the memory system 110.

The memory system 110 may operate to store data for the host 102 in response to a request of the host 102. Non-limiting examples of the memory system 110 may include a solid state drive (SSD), a multi-media card (MMC), a secure digital (SD) card, a universal storage bus (USB) device, a universal flash storage (UFS) device, compact flash (CF) card, a smart media card (SMC), a personal computer memory card international association (PCMCIA) card and memory stick. The MMC may include an embedded MMC (eMMC), a reduced size MMC (RS-MMC) and a micro-MMC, and the like. The SD card may include a mini-SD card and a micro-SD card.

The memory system 110 may be embodied by various types of storage devices. Examples of such storage devices may include, but are not limited to, volatile memory devices such as a DRAM dynamic random access memory (DRAM) and a static RAM (SRAM) and nonvolatile memory devices such as a read only memory (ROM), a mask ROM (MROM), a programmable ROM (PROM), an erasable programmable ROM (EPROM), an electrically erasable programmable ROM (EEPROM), a ferroelectric RAM (FRAM), a phase-change RAM (PRAM), a magneto-resistive RAM (MRAM), a resistive RAM (RRAM) and a flash memory. The flash memory may have a 3-dimensional (3D) stack structure.

The memory system 110 may include a memory device 150 and a controller 130. The memory device 150 may store data for the host 102, and the controller 130 may control data storage into the memory device 150.

The controller 130 and the memory device 150 may be integrated into a single semiconductor device, which may be included in the various types of memory systems as described above. By way of example and not limitation, the controller 130 and the memory device 150 may be integrated as a single semiconductor device to constitute an SSD. When the memory system 110 is used as an SSD, the operating speed of the host 102 connected to the memory system 110 can be improved. In addition, the controller 130 and the memory device 150 may be integrated as a single semiconductor device to constitute a memory card. For example, the controller 130 and the memory device 150 may constitute a memory card such as a PCMCIA (personal computer memory card international association) card, a CF card, a SMC (smart media card), memory stick, a MMC including a RS-MMC and a micro-MMC, a SD card including a mini-SD, a micro-SD and a SDHC, or an UFS device.

Non-limiting application examples of the memory system 110 may include a computer, an Ultra Mobile PC (UMPC), a workstation, a net-book, a Personal Digital Assistant (PDA), a portable computer, a web tablet, a tablet computer, a wireless phone, a mobile phone, a smart phone, an e-book, a Portable Multimedia Player (PMP), a portable game machine, a navigation system, a black box, a digital camera, a Digital Multimedia Broadcasting (DMB) player, a 3-dimensional television, a smart television, a digital audio recorder, a digital audio player, a digital picture recorder, a digital picture player, a digital video recorder, a digital video player, a storage device constituting a data center, a device capable of transmitting/receiving information in a wireless environment, one of various electronic devices constituting a home network, one of various electronic devices constituting a computer network, one of various electronic devices constituting a telematics network, a Radio Frequency Identification (RFID) device, or one of various components constituting a computing system.

The memory device 150 may be a nonvolatile memory device which may retain data stored therein even though power is not supplied. The memory device 150 may store data provided from the host 102 through a write operation, while outputting data stored therein to the host 102 through a read operation. The memory device 150 may include a plurality of memory blocks 152, 154, . . . , 156 (hereinafter, referred to as "memory blocks 152 to 156"). Each block may include a plurality of pages. Each page may include a plurality of memory cells coupled to a word line. In an embodiment, the memory device 150 may be a flash memory. The flash memory may have a 3-dimensional (3D) stack structure.

Since the structure of the memory device 150 including its 3D stack structure will be described in detail later with reference to FIGS. 2 to 4, further description of these elements and features are omitted here.

The controller 130 may control the memory device 150 in response to a request from the host 102. For example, the controller 130 may provide data read from the memory device 150 to the host 102. The controller 130 may store data provided from the host 102 into the memory device 150. For this operation, the controller 130 may control read, write, program and erase operations of the memory device 150.

The controller 130 may include a host interface (I/F) 132, a processor 134, an error correction code (ECC) component 138, a Power Management Unit (PMU) 140, a memory I/F 142 such as a NAND flash controller (NFC), and a memory 144 all operatively coupled via an internal bus.

The host interface 132 may be configured to process a command and data of the host 102. The host interface 132 may communicate with the host 102 through one or more of various interface protocols such as universal serial bus (USB), multi-media card (MMC), peripheral component interconnect-express (PCI-e or PCIe), small computer system interface (SCSI), serial-attached SCSI (SAS), serial advanced technology attachment (SATA), parallel advanced technology attachment (PATA), enhanced small disk interface (ESDI) and integrated drive electronics (IDE).

The ECC component 138 may detect and correct an error contained in the data read from the memory device 150. In other words, the ECC component 138 may perform an error correction decoding process to the data read from the memory device 150 through an ECC code used during an ECC encoding process. According to a result of the error correction decoding process, the ECC component 138 may output a signal, for example, an error correction success or fail signal. When the number of error bits is more than a threshold value of correctable error bits, the ECC component 138 may not correct the error bits. The ECC component 138 may output the error correction fail signal.

The ECC component 138 may perform error correction through a coded modulation such as Low Density Parity Check (LDPC) code, Bose-Chaudhri-Hocquenghem (BCH) code, turbo code, Reed-Solomon code, convolution code, Recursive Systematic Code (RSC), Trellis-Coded Modulation (TCM) and Block coded modulation (BCM). However, the ECC component 138 is not limited to any specific structure. The ECC component 138 may include other relevant circuits, modules, systems, programs or devices for error correction.

The PMU 140 may manage power used and provided in the controller 130.

The memory I/F 142 may serve as a memory/storage interface for providing an Interface between the controller 130 and the memory device 150 such that the controller 130 controls the memory device 150 in response to a request from the host 102. When the memory device 150 is a flash memory or specifically a NAND flash memory, the memory I/F 142 may generate a control signal for the memory device 150. The memory interface 142 may provide data for the memory device 150 under the control of the processor 134. The memory I/F 142 may work as an interface (e.g., a NAND flash interface) for handling a command and data between the controller 130 and the memory device 150. Specifically, the memory I/F 142 may support data transfer between the controller 130 and the memory device 150.

The memory 144 may serve as a working memory of the memory system 110 and the controller 130. The memory 144 may store data for driving the memory system 110 and the controller 130. The controller 130 may control the memory device 150 to perform read, write, program and erase operations in response to a request from the host 102. The controller 130 may provide data read from the memory device 150 to the host 102 or may store data provided from the host 102 into the memory device 150. The memory 144 may store data required for the controller 130 and the memory device 150 to perform these operations.

The memory 144 may be embodied by a volatile memory. By way of example and not limitation, the memory 144 may be embodied by static random access memory (SRAM) or dynamic random access memory (DRAM). The memory 144 may be disposed within or out of the controller 130. Although FIG. 1 illustrates as an example that the memory 144 disposed within the controller 130, the present invention is not limited thereto. For example, in an embodiment, the memory 144 may be embodied by an external volatile memory having a memory interface transferring data between the memory 144 and the controller 130.

The processor 134 may control overall operations of the memory system 110. The processor 134 may use a firmware (FW) to control the overall operations of the memory system 110. The firmware may be referred to as flash translation layer (FTL). Also, the processor 134 may be implemented with a microprocessor or a Central Processing Unit (CPU).

For example, the controller 130 may perform an operation requested by the host 102 in the memory device 150 through the processor 134, which is implemented with a microprocessor or a CPU. In other words, the controller 130 may perform a command operation corresponding to a command received from the host 102, or other source. The controller 130 may perform a foreground operation as the command operation corresponding to the command received from the host 102. For example, the foreground operation may include a program operation corresponding to a write command, a read operation corresponding to a read command, an erase operation corresponding to an erase command, and a parameter set operation corresponding to a set parameter command or a set feature command.

Also, the controller 130 may perform a background operation onto the memory device 150 through the processor 134, which is realized as a microprocessor or a CPU. The background operation performed onto the memory device 150 may include an operation of copying and processing data stored in some memory blocks among the memory blocks 152 to 156 of the memory device 150 into other memory blocks, e.g., a garbage collection (GC) operation, an operation of swapping between the memory blocks 152 to 156 or between the data of the memory blocks 152 to 156, e.g., a wear-leveling (WL) operation, an operation of storing the map data stored in the controller 130 in the memory blocks 152 to 156, e.g., a map flush operation, or an operation of managing bad blocks of the memory device 150, e.g., a bad block management operation of detecting and processing bad blocks among the memory blocks 152 to 156.

A memory device of the memory system in accordance with an embodiment of the present invention is described in detail with reference to FIGS. 2 to 4.

Figure 2:
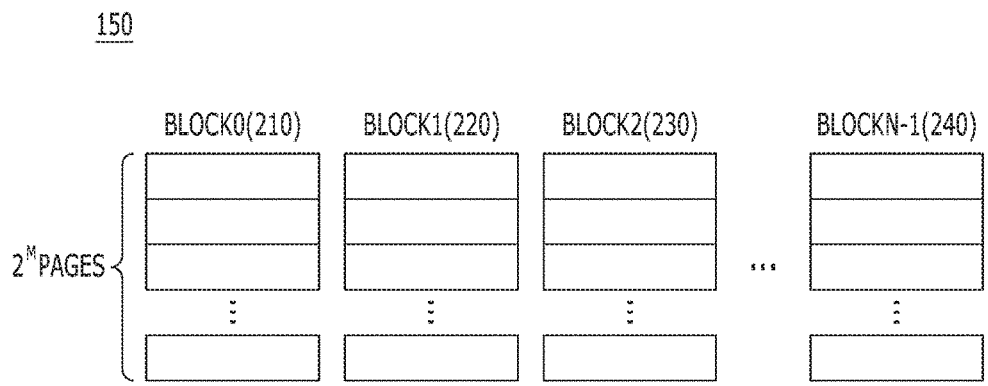
FIG. 2 is a schematic diagram illustrating an exemplary configuration of a memory device employed in a memory system of FIG. 1.

FIG. 2 is a schematic diagram illustrating the memory device 150 of FIG. 1.

Referring to FIG. 2, the memory device 150 may include a plurality of memory blocks BLOCK0 to BLOCKN−1, e.g., a memory block 0 BLOCK0(210), a memory block 1 BLOCK1(220), a memory block 2 BLOCK2(230), and a memory block N−1 BLOCKN−1(240). Here, N is an integer greater than 1. Each of the memory blocks 210, 220, 230, 240 may include a plurality of pages, for example $2^M$ pages, the number of which may vary according to circuit design. Here, M is an integer greater than 1. For example, in some applications, each of the memory blocks may include M pages. Each of the pages may include a plurality of memory cells that are coupled to a plurality of word lines WL.

Also, the memory device 150 may include a plurality of memory blocks, which may include a single level cell (SLC) memory block storing 1-bit data and/or a multi-level cell (MLC) memory block storing 2-bit data. The SLC memory blocks may include a plurality of pages that are realized by memory cells storing one-bit data in one memory cell. The SLC memory blocks may have a quick data operation performance and high durability. On the other hand, the MLC memory blocks may include a plurality of pages that are realized by memory cells storing multi-bit data, e.g., data of two or more bits, in one memory cell. The MLC memory blocks may have a greater data storing space than the SLC memory blocks. In other words, the MLC memory blocks may be highly integrated. Particularly, the memory device 150 may include not only the MLC memory blocks, each of which includes a plurality of pages that are realized by memory cells capable of storing two-bit data in one memory cell, but also triple level cell (TLC) memory blocks each of which includes a plurality of pages that are realized by memory cells capable of storing three-bit data in one memory cell, quadruple level cell (QLC) memory blocks each of which includes a plurality of pages that are realized by memory cells capable of storing four-bit data in one memory cell, and/or multiple level cell memory blocks each of which includes a plurality of pages that are realized by memory cells capable of storing five or more-bit data in one memory cell, and so forth.

In accordance with an embodiment of the present invention, the memory device 150 is described as a non-volatile memory, such as a flash memory, e.g., a NAND flash memory. However, the memory device 150 may also be implemented as any of a Phase Change Random Access Memory (PCRAM), a Resistive Random Access Memory (RRAM or ReRAM), a Ferroelectric Random Access Memory (FRAM), a Spin Transfer Torque Magnetic Random Access Memory (STT-RAM or STT-MRAM), and the like.

The memory blocks 210, 220, 230, 240 may store the data transferred from the host 102 through a program operation, while outputting data stored therein to the host 102 through a read operation.

Figure 3:
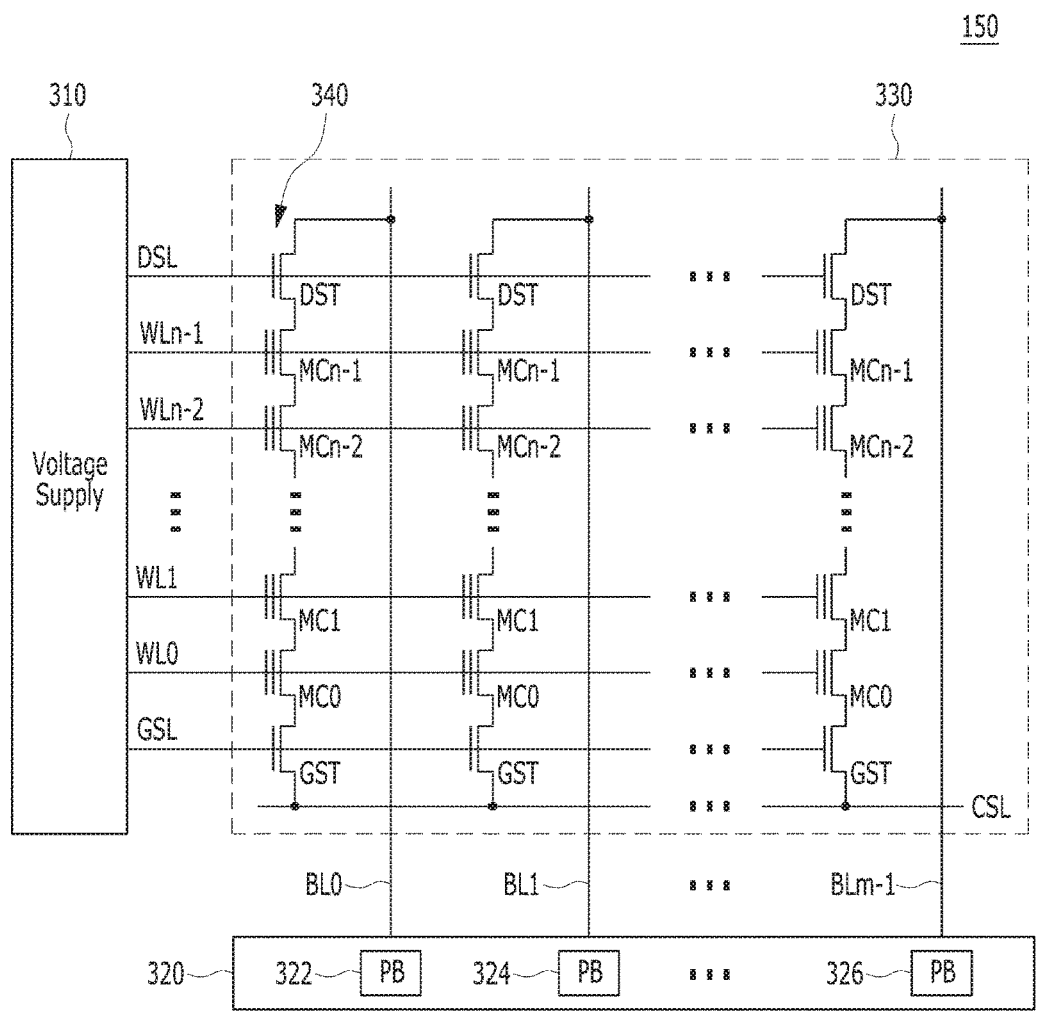
FIG. 3 is a circuit diagram illustrating an exemplary configuration of a memory cell array of a memory block in a memory device shown in FIG. 1.

FIG. 3 is a circuit diagram illustrating an exemplary configuration of a memory cell array of a memory block in the memory device 150 of FIG. 1.

Referring to FIG. 3, a memory block 330 which may correspond to any of the plurality of memory blocks 152 to 156 included in the memory device 150 of the memory system 110 may include a plurality of cell strings 340 coupled to a plurality of corresponding bit lines BL0 to BLm−1. The cell string 340 of each column may include one or more drain select transistors DST and one or more source select transistors SST. Between the drain and select transistors DST and SST, a plurality of memory cells MC0 to MCn−1 may be coupled in series. In an embodiment, each of the memory cell transistors MC0 to MCn−1 may be embodied by a SLC capable of storing 1-bit data or an MLC capable of storing data information of a plurality of bits. Each of the cell strings 340 may be electrically coupled to a corresponding bit line among the plurality of bit lines BL0 to BLm−1. For example, as illustrated in FIG. 3, the first cell string is coupled to the first bit line BL0, and the last cell string is coupled to the last bit line BLm−1.

Figure 4:
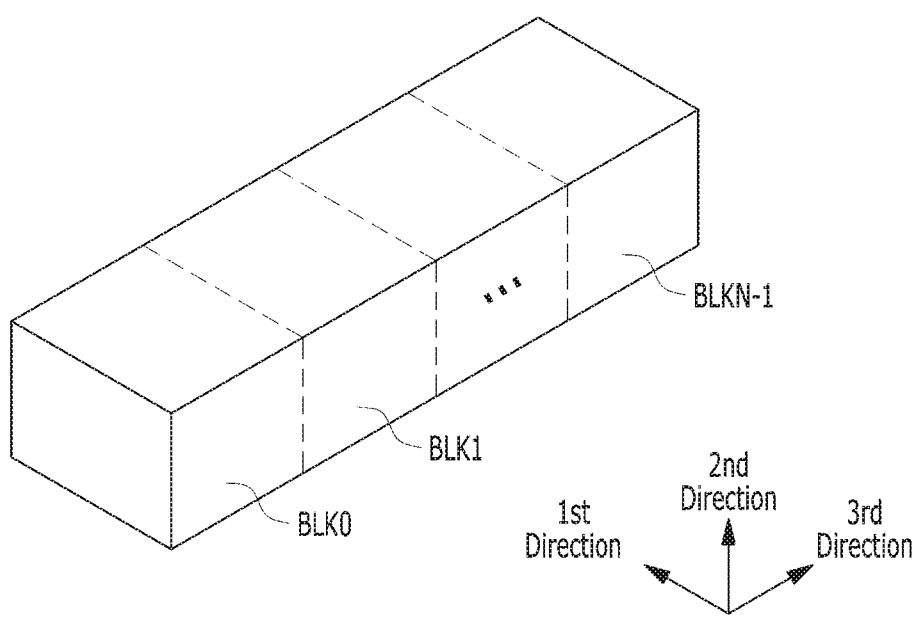
FIG. 4 is a schematic diagram illustrating an exemplary three-dimensional (3D) structure of the memory device of FIG. 2.

Each memory block 330 included in the memory device 150 may include a plurality of NAND strings NS that are extended in the second direction (see FIG. 4), and a plurality of NAND strings NS that are extended in the first direction (see FIG. 4) and the third direction (see FIG. 4). Each of the NAND strings NS may be coupled to a bit line BL among bit lines BL0 to BLm−1, at least one drain selection line DSL, at least one ground selection line GSL, a plurality of word lines WL0 to WLn−1, and a common source line CSL. Each of the NAND strings NS may include a plurality of transistor structures.

In short, each memory block 330 among the memory blocks 152 to 156 of the memory device 150 may be coupled to a plurality of bit lines BL0 to BLm−1, a plurality of drain selection line DSL, a plurality of ground selection lines GSL, a plurality of word lines WL0 to WLn−1, and a plurality of common source lines CSL. Each memory block 330 may include a plurality of NAND strings. Also, in each memory block 330, one bit line among plurality of bit lines BL0 to BLm−1 may be coupled to a plurality of NAND strings to realize a plurality of transistors in one NAND string NS. Also, a drain selection transistor DST of each NAND string NS may be coupled to a corresponding bit line among bit lines BL0 to BLm−1. A ground selection transistor GST of each NAND string may be coupled to a common source line CSL. Memory cells MC0 to MCn−1 may be provided between the drain selection transistor DST and the ground selection transistor GST of each NAND string. In other words, a plurality of memory cells may be realized in each memory block 330 of the memory blocks 152 to 156 of the memory device 150.

Although FIG. 3 illustrates NAND flash memory cells, the invention is not limited to NAND flash memory cells. It is noted that the memory cells may be NOR flash memory cells, or hybrid flash memory cells including two or more types of memory cells combined therein. Also, it is noted that the memory device 150 may be a flash memory device including a conductive floating gate as a charge storage layer or a charge trap flash (CTF) memory device including an insulation layer as a charge storage layer.

The memory device 150 may further include a voltage supply 310 which generates different word line voltages including a program voltage, a read voltage and a pass voltage to supply one of them to each of word lines (e.g., WL0 to WLn−1) according to an operation mode. The voltage generation operation of the voltage supply 310 may be controlled by a control circuit (not illustrated). Under the control of the control circuit, the voltage supply 310 may select at least one of the memory blocks (or sectors) of the memory cell array, select at least one of the word lines of the selected memory block, and provide the word line voltages to the selected word line and the unselected word lines as may be needed.

The memory device 150 may include a read/write circuit 320 which is controlled by the control circuit. During a verification/normal read operation, the read/write circuit 320 may operate as a sense amplifier for reading (e.g., sensing and amplifying) data from the memory cell array. During a program operation, the read/write circuit 320 may work as a write driver for supplying a voltage or a current into bit lines according to data to be stored in the memory cell array. During a program operation, the read/write circuit 320 may receive from a buffer (not illustrated) data to be stored into the memory cell array, and drive bit lines according to the received data. The read/write circuit 320 may include a plurality of page buffers 322 to 326 respectively corresponding to columns (or bit lines) or column pairs (or bit line pairs). Each of the page buffers 322 to 326 may include a plurality of latches (not illustrated).

FIG. 4 is a schematic diagram illustrating an exemplary 3D structure of the memory device 150 of FIG. 1. The memory blocks BLK0 to BLKN−1 shown in FIG. 4 may correspond to memory blocks 152 to 156 shown in FIG. 1.

Referring to FIG. 4, the memory device 150 may be embodied by a 2D or 3D memory device. Particularly, as illustrated in FIG. 4, the memory device 150 may be embodied by a nonvolatile memory device having a 3D stack structure. When the memory device 150 has a 3D structure, the memory device 150 may include a plurality of memory blocks BLK0 to BLKN−1. For example, the memory blocks BLK0 to BLKN−1 have a three-dimensional structure with dimensions extending in first to third directions, e.g., an x-axis direction (first direction), a y-axis direction (second direction), and a z-axis direction (third direction).

A data processing operation performed in the memory system in accordance with various embodiments of the present invention is described in detail with reference to FIGS. 5 to 10C.

Figure 5:
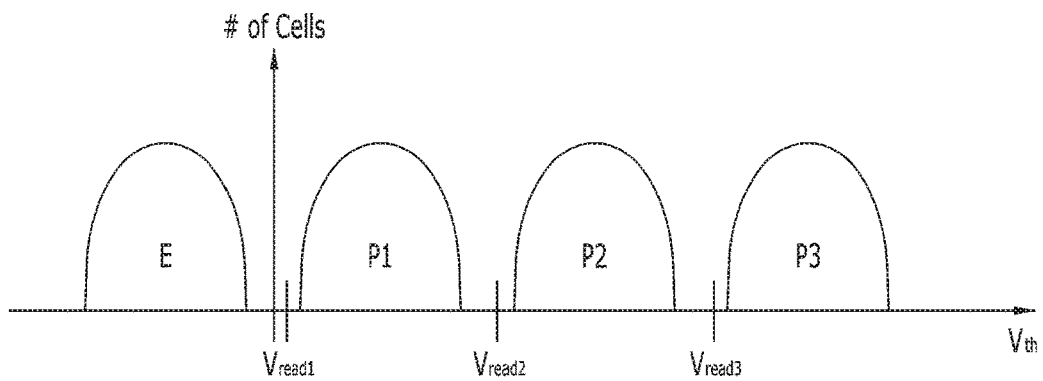
FIG. 5 is a graph showing exemplary threshold voltage distributions indicating program and erase states of a multi-level cell memory device.

FIG. 5 is a graph showing exemplary threshold voltage distributions of a plural-level cell memory device, especially, threshold voltage distributions indicating program and erase states of a multi-level cell (MLC) memory device.

The plural-level cell memory device refers to a memory device capable of storing data having a plurality of bits in a single memory cell.

The plural-level cell memory device may include the MLC memory device, the TLC memory device, the QLC memory device, and the multiple level cell memory device as described above with reference to FIG. 2.

Due to a small differences in electrical characteristics between a plurality of memory cells, a threshold voltage of each of the memory cells in which the same data is programmed may be a predetermined range of threshold voltage distributions. For example, when a multi-level cell (MLC) is programmed, the MLC has any one of three program states P1 to P3 and an erase state E. FIG. 5 is an ideal distribution diagram of states that the MLC may have. Each of threshold voltage distributions shown in FIG. 5 has a predetermined range of a read voltage margin without overlapping with each other.

Figure 6:
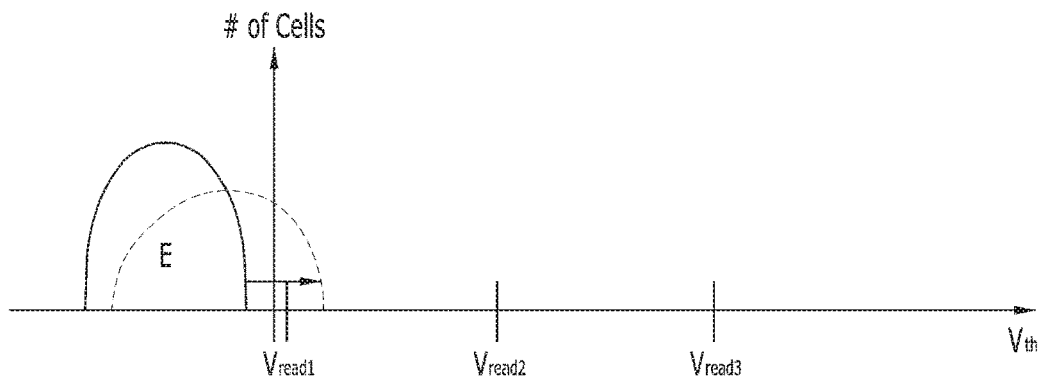
FIG. 6 is a graph showing exemplary threshold voltage distributions of a multi-level cell memory device when erase cell disturbance occurs.

FIG. 6 is a graph showing exemplary threshold voltage distributions of the MLC memory device when erase cell disturbance occurs.

An open memory block is a memory block in which all memory cells are not yet programmed. In other words, some of the memory cells included in the open memory block are in the program state, but remaining memory cells are in the erase state.

Since a pass voltage is also applied to an unselected word line during a read operation, a disturbance phenomenon occurs in which a threshold voltage of a neighboring memory cell increases. When the threshold voltage of the memory cell is greatly changed due to the intensified disturbance phenomenon, a value stored in the memory cell may be distorted.

Herein, a phenomenon in which a threshold voltage of a memory cell in the erase state rises with a read voltage applied to a word line coupled to a programmed memory cell in an open memory block is defined as an "erase cell disturbance phenomenon." When the erase cell disturbance phenomenon is intensified, the memory cell in the erase state may be distorted and recognized as being in the program state. When a program operation is performed onto the memory cell in the state distorted due to the erase cell disturbance phenomenon, an uncorrectable error that may not be cured by an error correction decoding operation may occur.

In order to avoid or prevent the error, when the erase cell disturbance phenomenon of the open memory block occurs more than a reference value, the memory block may be closed. For example, when a read number of the open memory block exceeds a predetermined threshold value, it may be determined that an error due to the erase cell disturbance phenomenon may have occurred in the memory block. In this case, dummy data is programmed into all memory cells in the erase state and the memory block is closed so that the memory block may not be used.

Such a method to prevent the error as described above may improve reliability of data. However, when the open memory block becomes closed, a word line in the erase state may not be used. Consequently, performance of the memory device may be degraded.

In order to prevent such a problem, embodiments of the present invention may provide a method of performing the program operation onto the memory cell in the erase state in an M-bit cell mode, where M is an integer smaller than N, instead of closing a plural level cell open memory block capable of storing N-bit data in a single memory cell when read disturbance occurs more than a reference value in the memory block.

When a memory block including an N-bit plural level cell is programmed in the M-bit cell mode, a read voltage margin of the memory cell may increase. In this case, when a read voltage that distinguishes the erase state and the program state, for example, such as Vread1 shown in FIG. 6, is set to be somewhat high, the memory cell in the erase state may be read as being still in the erase state even though a threshold voltage of the memory cell is increased due to the erase cell disturbance phenomenon. Accordingly, an uncorrectable error due to the erase cell disturbance phenomenon may be prevented.

Figure 7:
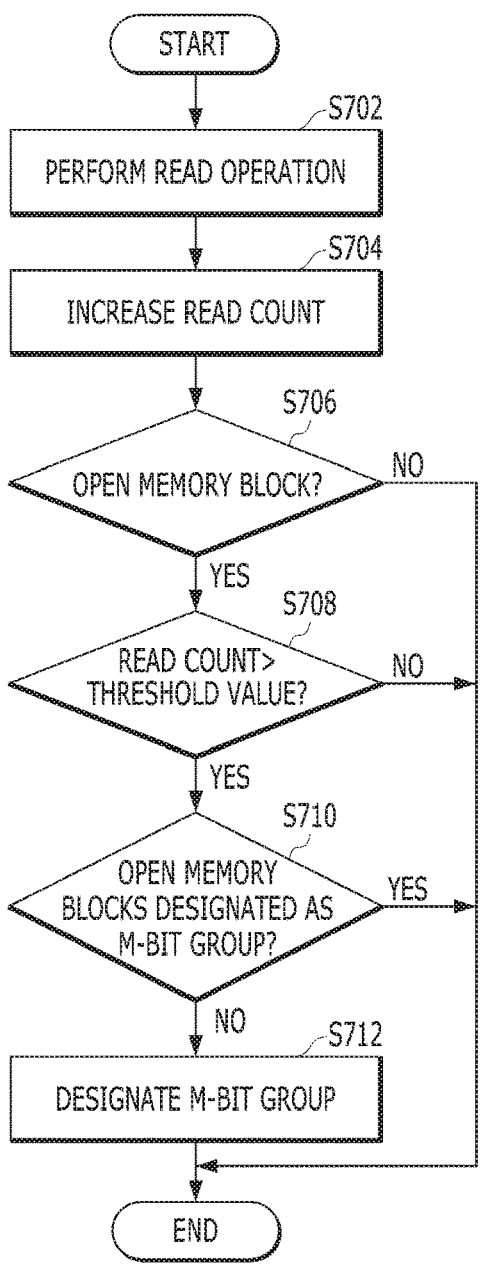
FIG. 7 is a flowchart describing an operation of a memory system in accordance with an embodiment of the present invention.

FIG. 7 is a flowchart describing an operation of the memory system 100 in accordance with an embodiment of the present invention.

In step S702, the controller 130 may control a read operation of the N-bit plural level cell memory device 150 in response to a read command of the host 102.

In step S704, the controller 130 may increase a read count for a memory block on which the read operation is performed. The memory block may be a super block.

In step S706, the controller 130 may check whether the memory block on which the read operation is performed is an open memory block.

When the memory block is the open memory block (that is, "YES" in step S706), the controller 130 may check whether the read count exceeds a predetermined threshold value in step S708. When the memory block is not the open memory block (that is, "NO" in step S706), the operation of the memory system 100 may be completed.

When the read count does not exceed the threshold value (that is, "NO" in step S708), the operation of the memory system 100 may be completed.

When the read count exceeds the threshold value (that is, "YES" in step S708), the controller 130 may check whether memory cells in the erase state included in the memory block, that is, the open memory block are designated as an M-bit group in step S710.

When the memory cells in the erase state are not designated as the M-bit group (that is, "NO" in step S710), the controller 130 may designate the memory cells in the erase state as the M-bit group in step S712. Accordingly, the M-bit group may represent the memory cells being in the erase state when the read count of the open memory block exceeds the threshold value.

When the memory cells in the erase state are designated as the M-bit group (that is, "YES" in step S710), the operation of the memory system 100 may be completed.

The controller 130 may control the memory device 150 to perform the program operation onto the designated M-bit group in the M-bit mode and perform the read operation onto the programmed group in the M-bit mode. At this time, the controller 130 may control a read voltage. Particularly, the controller 130 may set the read voltage, which distinguishes the erase state and the program state, to be somewhat high.

With reference to FIGS. 8A to 9B, specific examples in which a memory cell is programmed in a single level cell (SLC) to increase a read voltage margin in the MLC memory device will be provided below.

Figure 8A:
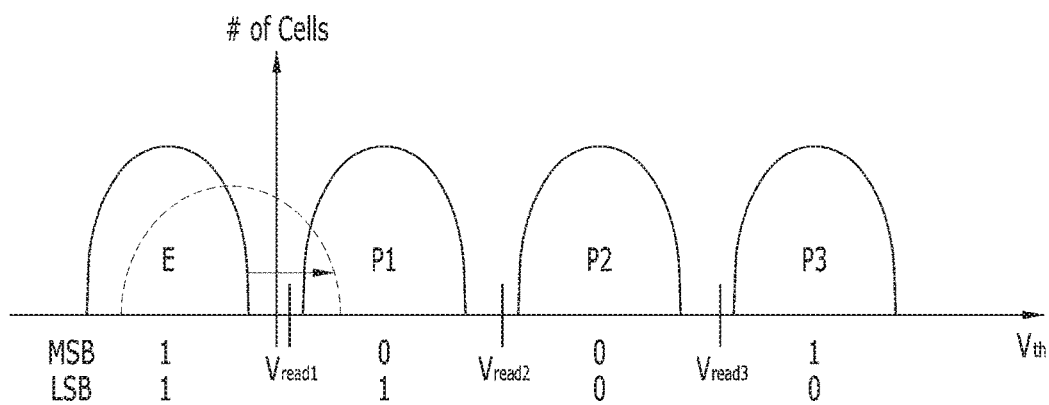
FIG. 8A is a graph showing an example of data values stored according to threshold voltage distributions in a multi-level cell memory device.

FIG. 8A is a graph showing an example of data values stored according to threshold voltage distributions in the MLC memory device.

Referring to FIG. 8A, each of threshold voltage distributions E, P1, P2, and P3 may be mapped in a gray code. A first erase state E, a first program state P1, a second program state P2 and a third program state P3 may have logic values of '11', '01', '00', '10', respectively. For example, when the memory device 150 is a 2D NAND flash memory, the states may have the data values as shown in FIG. 8A.

A change in the threshold voltage distributions is represented by a structure in a dotted line shown in FIG. 8A. That is, the structure in the dotted line shows that the threshold voltage distributions are changed because a threshold voltage of a memory cell in the erase state increases due to the erase cell disturbance phenomenon. When a read voltage Vread1 is applied to read the memory cell, the memory cell in the erase state may be distorted and recognized as the program state P1.

Figure 8B:
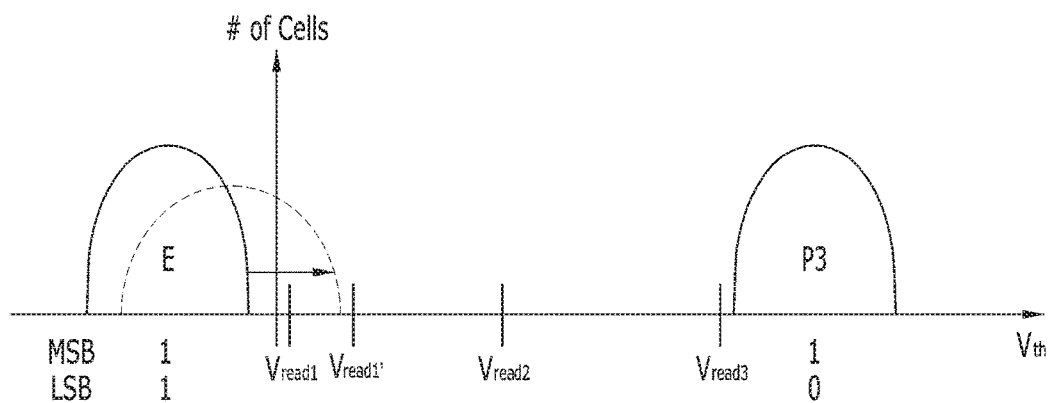
FIGS. 8B and 8C are graphs showing threshold voltage distributions of a multi-level cell memory device in accordance with an embodiment of the present invention.

FIG. 8B is a graph showing threshold voltage distributions of the MLC memory device in accordance with an embodiment of the present invention.

When a memory cell is programmed in the SLC, the memory device 150 may program user data in the LSB and program dummy data in the MSB.

For example, the dummy data may have a logic value of '1'. In this case, since a memory cell including in a SLC group has any one of logic values of '11' or '10' and has any one of the states E or P3, a threshold voltage margin may increase more greatly when the memory cell is programmed in the SLC than when the memory cell is programmed in the MLC.

When the controller 130 sets a read voltage for distinguishing the erase state and the program state to Vread1' that is higher than Vread1, a memory cell in which the erase cell disturbance phenomenon occurs may be still read as being in the erase state during the read operation. On the other hand, a memory cell programmed with the logic value of '10' may be read as being in the program state because the memory cell has the state P3. Accordingly, an uncorrectable error due to the erase cell disturbance phenomenon may be prevented.

According to an embodiment of the present invention, the memory device 150 may program the user data in the LSB and program the same data in the MSB. In this case, since a memory cell included in the SLC group has any one of logic values '11' or '00' and has any one of the states E or P2 shown in FIG. 8A, the threshold voltage margin may increase more greatly when the memory cell is programmed in the SLC than when the memory cell is programmed in the MLC.

Figure 8C:
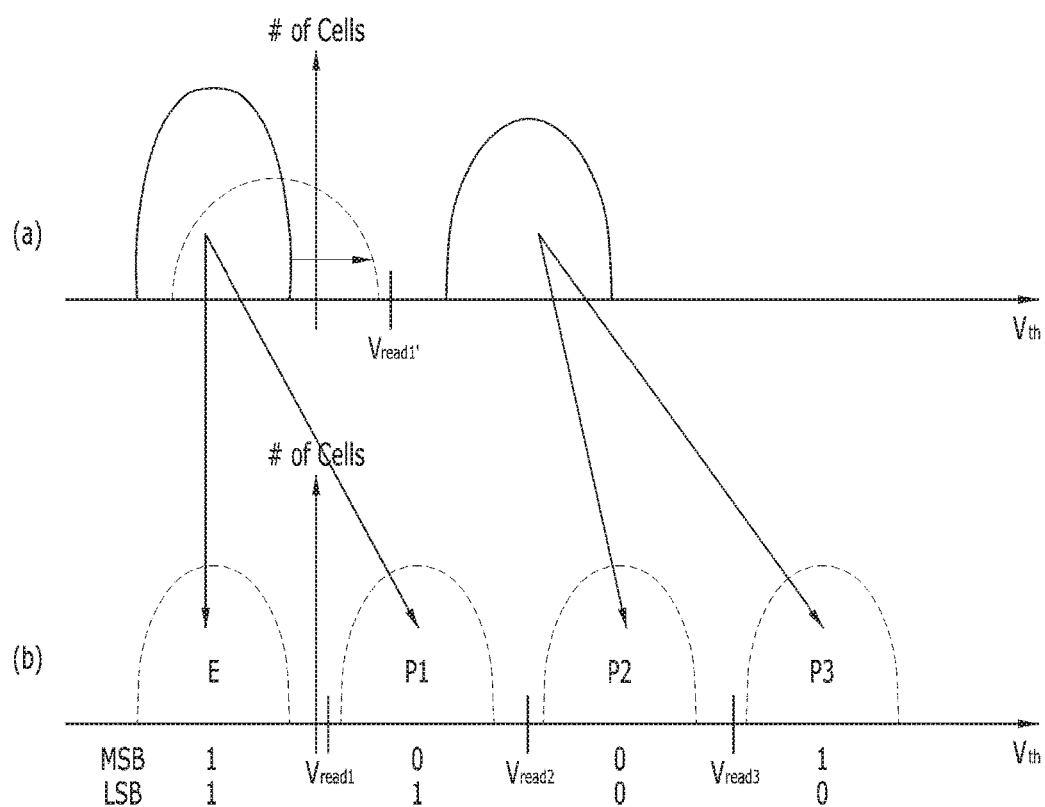

FIG. 8C is a graph showing threshold voltage distributions of the MLC memory device in accordance with an embodiment of the present invention.

The memory device 150 may program user data in the LSB and may not perform the program operation onto the MSB. A top graph (denoted as "(a)") of FIG. 8C is a graph after the memory cell is programmed in the LSB, and a bottom graph (denoted as "(b)") of FIG. 8C is a graph after the memory cell is programmed in the LSB, and then programmed in the MSB so that an MLC program is completed.

Referring to FIG. 8C, a threshold voltage margin may increase when the memory cell is programmed only in the LSB more than when the memory cell is programmed in the MLC. Similar to FIG. 8B, when the controller 130 sets the read voltage for distinguishing the erase state and the program state to be high, an uncorrectable error due to the erase cell disturbance phenomenon may be prevented.

Figure 9A:
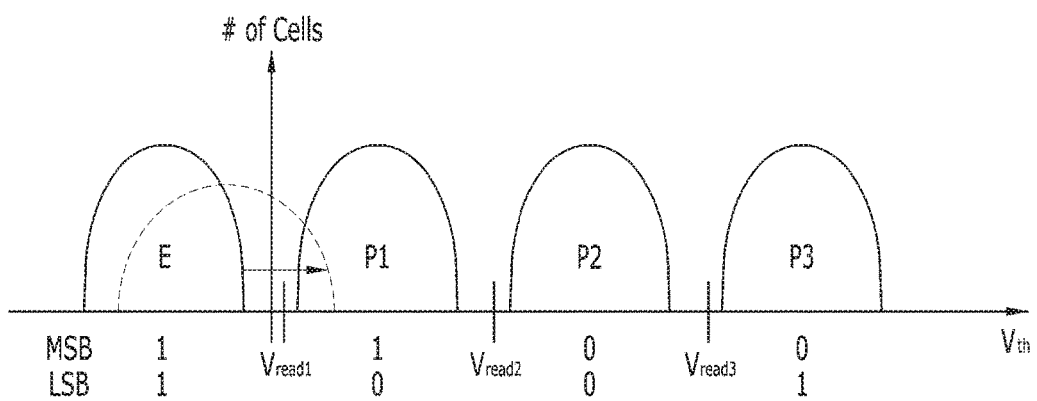
FIG. 9A is a graph showing an example of data values stored according to threshold voltage distributions in a multi-level cell memory device.

FIG. 9A is a graph showing an example of data values stored according to threshold voltage distributions in the MLC memory device.

Referring to FIG. 9A, each of the threshold voltage distributions E, P1, P2, and P3 may be mapped in a gray code. An erase state E, a first program state P1, a second program state P2, and a third program state P3 may have logic values of '11', '10', '00', '01', respectively. For example, when the memory device 150 is a 3D NAND flash memory, the states may have the data values as shown in FIG. 9A.

Figure 9B:
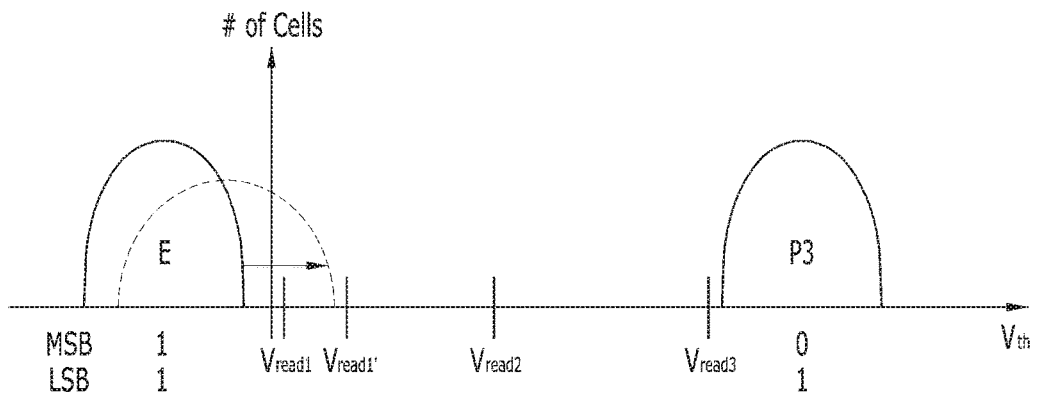
FIG. 9B is a graph showing threshold voltage distributions of a multi-level cell memory device in accordance with an embodiment of the present invention.

FIG. 9B is a graph showing threshold voltage distributions of the MLC memory device in accordance with an embodiment of the present invention.

When a memory cell is programmed in the SLC, the memory device 150 may program dummy data in the LSB and program user data in the MSB.

According to an embodiment of the present invention, the dummy data may have any one of a logic value of '0' or '1'.

According to an embodiment of the present invention, the dummy data may have a logic value of '1.' In this case, since a memory cell including in a SLC group has any one of logic values of '11' or '01' and has any one of the states E or P3 as shown in FIG. 9B, a threshold voltage margin may increase more greatly when the memory cell is programmed in the SLC than when the memory cell is programmed in the MLC.

According to an embodiment of the present invention, the memory device 150 may program the user data in the MSB and program the same data in the LSB. In this case, since a memory cell included in the SLC group has any one of logic values '11' or '00' and has any one of the states E or P2 as shown in FIG. 9A, the threshold voltage margin may increase more greatly when the memory cell is programmed in the SLC than when the memory cell is programmed in the MLC.

Similar to FIG. 8B, when the controller 130 sets the read voltage that distinguishes the erase state and the program state to be high, an uncorrectable error due to the erase cell disturbance phenomenon may be prevented.

Figure 10A:
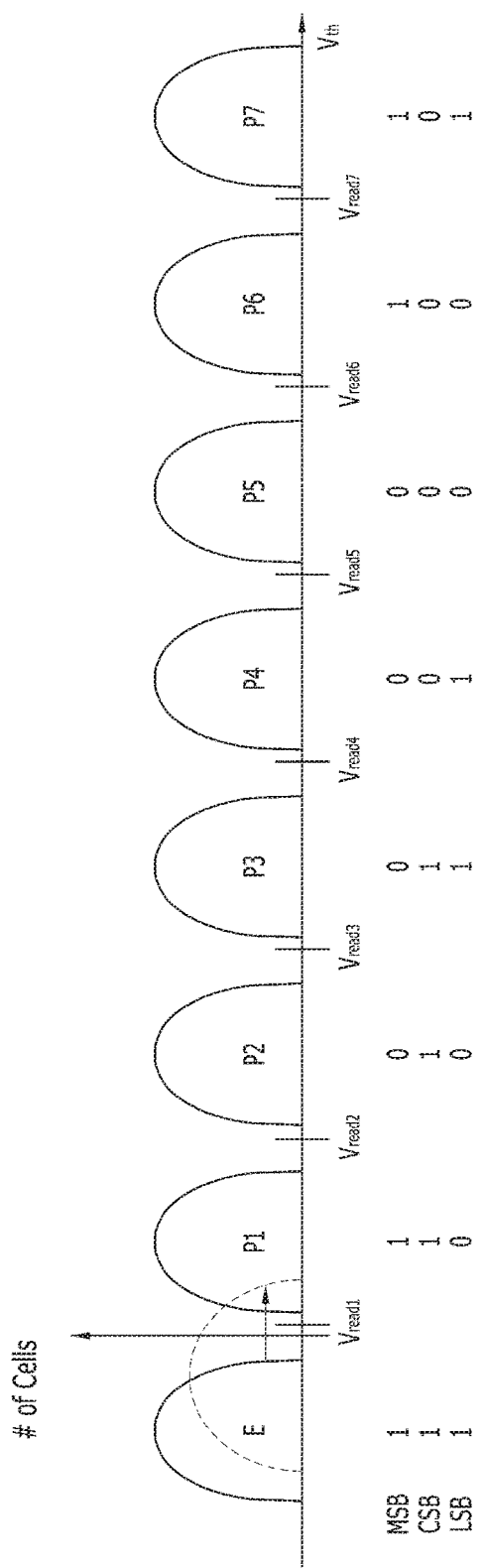
FIG. 10A is a graph showing an example of data values stored according to threshold voltage distributions in a triple-level cell memory device.

FIG. 10A is a graph showing an example of data values stored according to threshold voltage distributions in a triple-level cell memory (TLC) device.

Referring to FIG. 10A, each of the threshold voltage distributions E, P1, P2, P3, P4, P5, P6, and P7 (hereinafter, referred to as "E to P7") may be mapped in a gray code. For example, the threshold voltage distributions E to P7 may have logic values of '111,' '110,' '010,' '011,' '001,' '000,' '100,' '101,' respectively.

A change of the threshold voltage distributions is represented by a structure in a dotted line shown in FIG. 10A. That is, the structure in the dotted line shows that the threshold voltage distributions are changed because a threshold voltage of a memory cell in the erase state increases due to the erase cell disturbance phenomenon. When a read voltage Vread1 is applied to the memory cell, the memory cell in the erase state may be distorted and recognized as the program state P1.

Figure 10B:
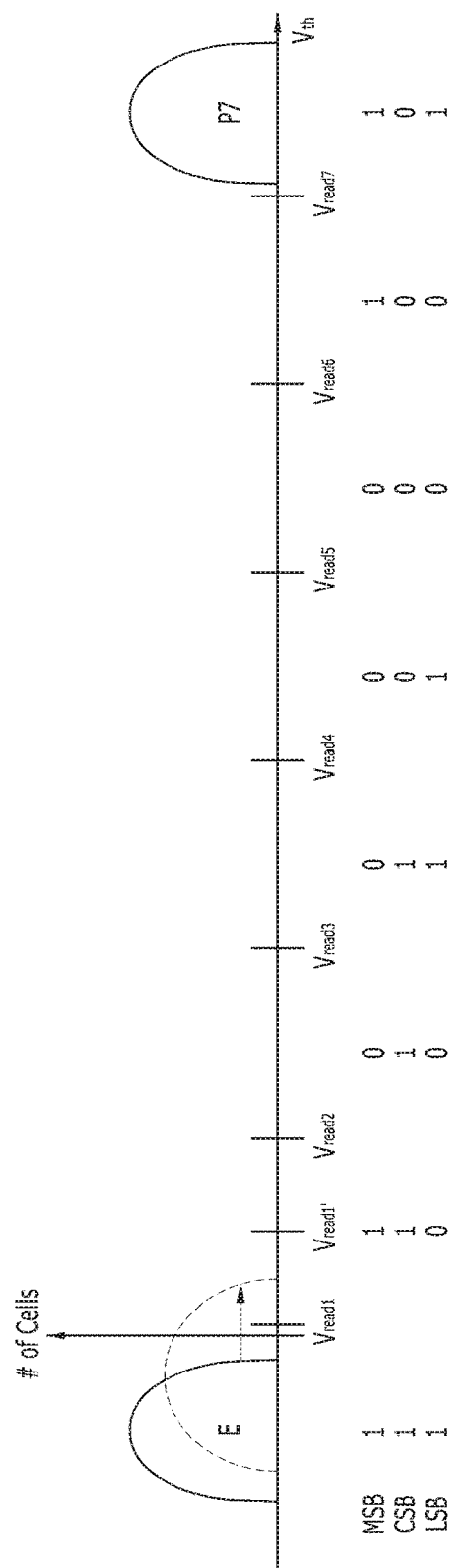
FIGS. 10B and 10C are graphs showing threshold voltage distributions of a triple-level cell memory device in accordance with an embodiment of the present invention.

FIG. 10B is a graph showing threshold voltage distributions of the TLC memory device when a memory cell is programmed in the SLC in accordance with an embodiment of the present invention.

When the memory cell is programmed in the SLC in the TLC memory device, the memory device 150 may program user data in a CSB and program dummy data in the MSB and LSB. According to an embodiment of the present invention, the dummy data may have a logic value of '1'. In this case, the memory cell may have any one of threshold voltages states E or P7. Accordingly, a threshold voltage margin may increase more greatly when the memory cell is programmed in the SLC than when the memory cell is programmed in the TLC.

When the controller 130 sets a read voltage for distinguishing the erase state and the program state to Vread1' that is higher than Vread1, a memory cell in which the erase cell disturbance phenomenon occurs may be still read as being in the erase state during the read operation. On the other hand, a programmed memory cell may be read as being in the program state because the memory cell has the state P7. Accordingly, an uncorrectable error due to the erase cell disturbance phenomenon may be prevented.

According to an embodiment of the present invention, the threshold voltage distributions may be mapped in another gray code. In the TLC memory device, the memory device 150 may program the user data in any one bit of the LSB, CSB and MSB and program dummy data in remaining two bits so that the threshold voltage margin may increase.

Figure 10C:
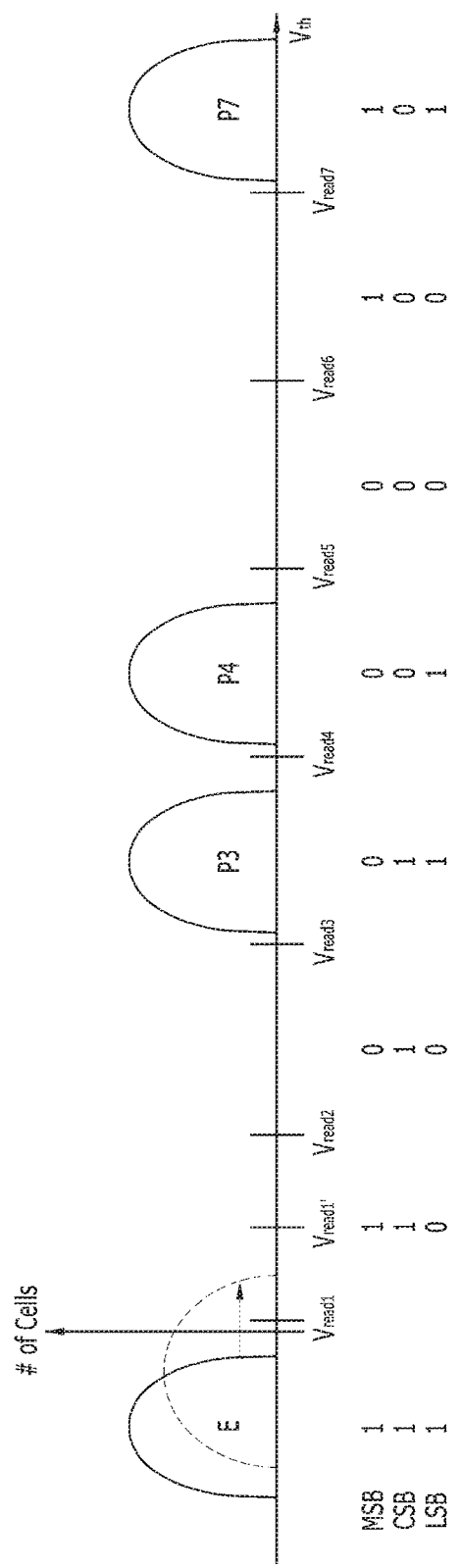

FIG. 10C is a graph showing threshold voltage distributions of the TLC memory device when a memory cell is programmed in the MLC in accordance with an embodiment of the present invention.

The memory device 150 may program user data in the MSB and CSB and program dummy data in the LSB. According to an embodiment, the dummy data may have a logic value of '1'. Referring to FIG. 10, the memory cell may have any one of threshold voltage states E, P3, P4, or P7.

When the controller 130 sets a read voltage for distinguishing the erase state and the program state to Vread1' that is higher than Vread1, a memory cell in which the erase cell disturbance phenomenon occurs may be still read as being in the erase state. A programmed memory cell may be read as being in the program state because the memory cell has any one of the states P3, P4, or P7. Accordingly, an uncorrectable error due to the erase cell disturbance phenomenon may be prevented.

According to an embodiment of the present invention, the threshold voltage distributions may be mapped in another gray code. In the TLC memory device, the memory device 150 may program the user data in two bits of the LSB, CSB and MSB and program dummy data in remaining one bit so that the threshold voltage margin may increase.

Although a method of programming the MLC memory device in the SLC or programming the TLC memory device in the SLC or MLC to increase a read voltage margin is described according to various embodiments, the present invention is not limited to this.

Although not described in detail herein, when there is a possibility of an uncorrectable error due to the erase cell disturbance phenomenon even in a quadruple level cell (QLC) memory device, memory cell in the erase state may be designated as at least one of the TLC group, the MLC group and the SLC Group to access at least one mode.

If the memory cells in the erase state are programmed in the M-bit mode as described above even when the erase cell disturbance phenomenon occurs more than a reference value in a plural-level cell open memory block, the read voltage margin may increase. When the programmed data is read in the M-bit mode, it is possible to prevent an uncorrectable error from occurring even if the erase cell disturbance phenomenon occurs as shown in FIG. 6.

Therefore, instead of writing the dummy data in the memory cells in the erase state and closing the corresponding memory block, it is possible to improve the performance of the memory system 110 by designating the memory cells as the M-bit group and programming the memory cells in the M-bit mode.

Hereinafter, various application examples of a data processing system and electronic devices to which the memory system 110 including the memory device 150 and the controller 130, which are described above with references to FIGS. 1 to 10C, will be described with reference to FIGS. 11 to 19.

Figure 11:
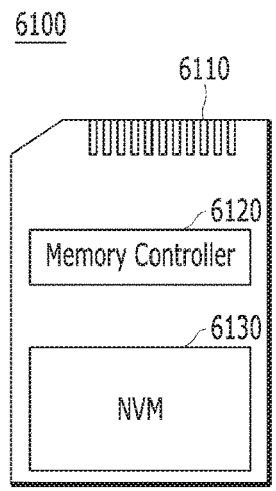
FIGS. 11 to 19 are diagrams schematically illustrating application examples of the data processing system in accordance with various embodiments of the present invention.

FIG. 11 is a diagram schematically illustrating an example of the data processing system including the memory system in accordance with the present embodiment. Specifically, FIG. 11 schematically illustrates a memory card system to which the memory system in accordance with the present embodiment is applied.

Referring to FIG. 11, the memory card system 6100 may include a memory controller 6120, a memory device 6130 and a connector 6110.

More specifically, the memory controller 6120, configured to access the memory device 6130, may be electrically connected to the memory device 6130, embodied by a nonvolatile memory. For example, the memory controller 6120 may be configured to control read, write, erase and background operations of the memory device 6130. The memory controller 6120 may be configured to provide an interface between the memory device 6130 and a host, and to use a firmware for controlling the memory device 6130. That is, the memory controller 6120 may correspond to the controller 130 of the memory system 110 described with reference to FIG. 1, while the memory device 6130 may correspond to the memory device 150 of the memory system 110 described with reference to FIG. 1.

Thus, the memory controller 6120 may include a RAM, a processing unit, a host interface, a memory interface and an error correction component.

The memory controller 6120 may communicate with an external device, for example, the host 102 of FIG. 1 through the connector 6110. By the way of example but not limitation, as described with reference to FIG. 1, the memory controller 6120 may be configured to communicate with an external device through one or more of various communication protocols such as universal serial bus (USB), multimedia card (MMC), embedded MMC (eMMC), peripheral component interconnection (PCI), PCI express (PCIe), Advanced Technology Attachment (ATA), Serial-ATA, Parallel-ATA, small computer system interface (SCSI), enhanced small disk interface (EDSI), Integrated Drive Electronics (IDE), Firewire, universal flash storage (UFS), WIFI and Bluetooth. Thus, the memory system and the data processing system in accordance with the present embodiment may be applied to wired/wireless electronic devices or specific mobile electronic devices.

The memory device 6130 may be implemented with a nonvolatile memory. By the way of example but not limitation, the memory device 6130 may be implemented with various nonvolatile memory devices such as an erasable and programmable ROM (EPROM), an electrically erasable and programmable ROM (EEPROM), a NAND flash memory, a NOR flash memory, a phase-change RAM (PRAM), a resistive RAM (ReRAM), a ferroelectric RAM (FRAM) and a spin torque transfer magnetic RAM (STT-RAM).

The memory controller 6120 and the memory device 6130 may be integrated into a single semiconductor device. For example, the memory controller 6120 and the memory device 6130 may construct a solid-state driver (SSD) by being integrated into a single semiconductor device. Also, the memory controller 6120 and the memory device 6130 may construct a memory card such as a PC card (PCMCIA: Personal Computer Memory Card International Association), a compact flash (CF) card, a smart media card (e.g., a SM and a SMC), a memory stick, a multimedia card (e.g., a MMC, a RS-MMC, a MMCmicro and an eMMC), an SD card (e.g., a SD, a miniSD, a microSD and a SDHC) and a universal flash storage (UFS).

Figure 12:
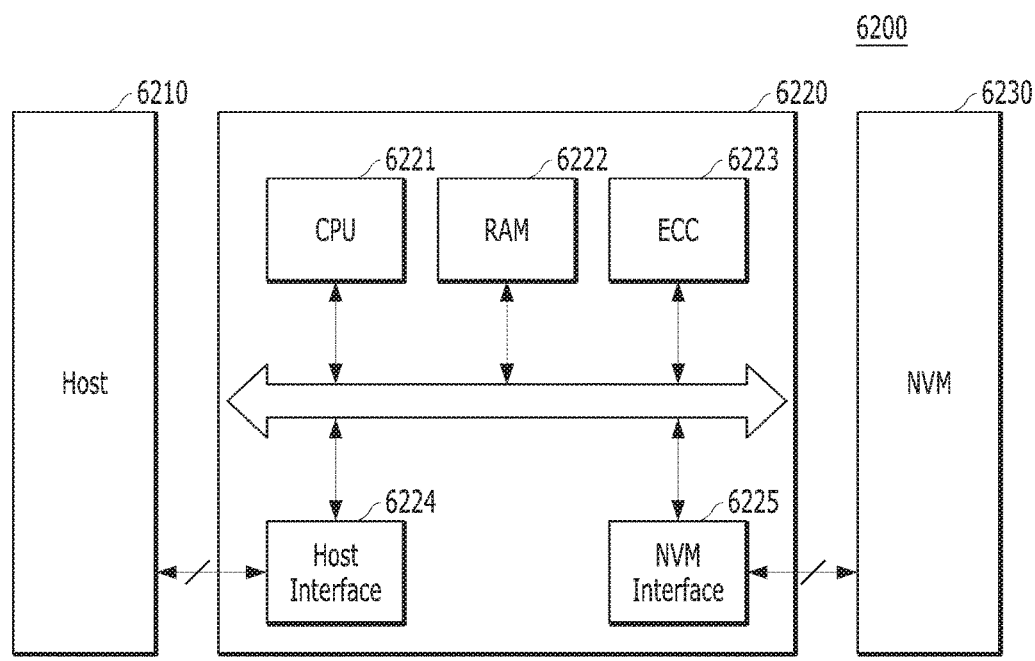

FIG. 12 is a diagram schematically illustrating another example of the data processing system including the memory system in accordance with the present embodiment.

Referring to FIG. 12, the data processing system 6200 may include a memory device 6230 having one or more nonvolatile memories and a memory controller 6220 for controlling the memory device 6230. The data processing system 6200 illustrated in FIG. 12 may serve as a storage medium such as a memory card (a CF, a SD, a micro-SD or the like) or USB device, as described with reference to FIG. 1. The memory device 6230 may correspond to the memory device 150 in the memory system 110 illustrated in FIG. 1. The memory controller 6220 may correspond to the controller 130 in the memory system 110 illustrated in FIG. 1.

The memory controller 6220 may control a read, write or erase operation on the memory device 6230 in response to a request of the host 6210. The memory controller 6220 may include one or more CPUs 6221, a buffer memory such as RAM 6222, an ECC circuit 6223, a host interface 6224 and a memory interface such as an NVM interface 6225.

The CPU 6221 may control overall operations on the memory device 6230, for example, read, write, file system management and bad page management operations. The RAM 6222 may be operated according to control of the CPU 6221, and used as a work memory, buffer memory or cache memory. When the RAM 6222 is used as a work memory, data processed by the CPU 6221 may be temporarily stored in the RAM 6222. When the RAM 6222 is used as a buffer memory, the RAM 6222 may be used for buffering data transmitted to the memory device 6230 from the host 6210 or vice versa. When the RAM 6222 is used as a cache memory, the RAM 6222 may assist the low-speed memory device 6230 to operate at high speed.

The ECC circuit 6223 may correspond to the ECC 138 of the controller 130 illustrated in FIG. 1. As described with reference to FIG. 1, the ECC circuit 6223 may generate an ECC (Error Correction Code) for correcting a fail bit or error bit of data provided from the memory device 6230. The ECC circuit 6223 may perform error correction encoding on data provided to the memory device 6230, thereby forming data with a parity bit. The parity bit may be stored in the memory device 6230. The ECC circuit 6223 may perform error correction decoding on data outputted from the memory device 6230. At this time, the ECC circuit 6223 may correct an error using the parity bit. For example, as described with reference to FIG. 1, the ECC circuit 6223 may correct an error using the LDPC code, BCH code, turbo code, Reed-Solomon code, convolution code, RSC or coded modulation such as TCM or BCM.

The memory controller 6220 may transmit/receive data to/from the host 6210 through the host interface 6224. The memory controller 6220 may transmit/receive data to/from the memory device 6230 through the NVM interface 6225. The host interface 6224 may be connected to the host 6210 via a PATA bus, SATA bus, SCSI, USB, PCIe or NAND interface. The memory controller 6220 may carry out a wireless communication function with a mobile communication protocol such as WiFi or Long Term Evolution (LTE). The memory controller 6220 may be connected to an external device, for example, the host 6210 or another external device, and then transmit/receive data to/from the external device. As the memory controller 6220 is configured to communicate with the external device through one or more of various communication protocols, the memory system and the data processing system in accordance with the present embodiment may be applied to wired/wireless electronic devices or particularly a mobile electronic device.

Figure 13:
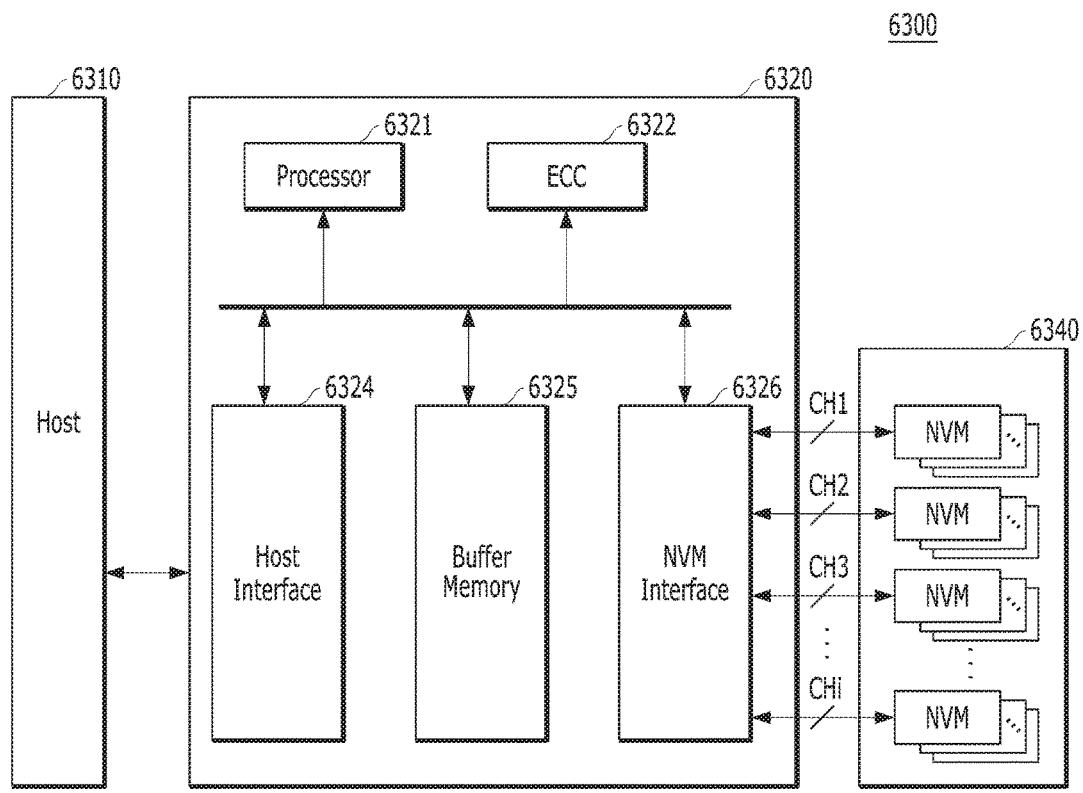

FIG. 13 is a diagram schematically illustrating another example of the data processing system including the memory system in accordance with the present embodiment. Specifically, FIG. 13 schematically illustrates an SSD to which the memory system in accordance with the present embodiment is applied.

Referring to FIG. 13, the SSD 6300 may include a controller 6320 and a memory device 6340 including a plurality of nonvolatile memories. The controller 6320 may correspond to the controller 130 in the memory system 110 of FIG. 1, and the memory device 6340 may correspond to the memory device 150 in the memory system of FIG. 1.

More specifically, the controller 6320 may be connected to the memory device 6340 through a plurality of channels CH1 to CHi. The controller 6320 may include one or more processors 6321, a buffer memory 6325, an ECC circuit 6322, a host interface 6324 and a memory interface, for example, a nonvolatile memory interface 6326.

The buffer memory 6325 may temporarily store data provided from the host 6310 or data provided from a plurality of flash memories NVM included in the memory device 6340. Further, the buffer memory 6325 may temporarily store meta data of the plurality of flash memories NVM, for example, map data including a mapping table. The buffer memory 6325 may be embodied by volatile memories such as a DRAM, a SDRAM, a DDR SDRAM, a LPDDR SDRAM and a GRAM or nonvolatile memories such as a FRAM, a ReRAM, a STT-MRAM and a PRAM. For convenience of description, FIG. 8 illustrates that the buffer memory 6325 exists in the controller 6320. However, the buffer memory 6325 may be arranged outside the controller 6320.

The ECC circuit 6322 may calculate an ECC value of data to be programmed to the memory device 6340 during a program operation, perform an error correction operation on data read from the memory device 6340 based on the ECC value during a read operation, and perform an error correction operation on data recovered from the memory device 6340 during a failed data recovery operation.

The host interface 6324 may provide an interface function with an external device, for example, the host 6310, and the nonvolatile memory interface 6326 may provide an interface function with the memory device 6340 connected through the plurality of channels.

Furthermore, a plurality of SSDs 6300 to which the memory system 110 of FIG. 1 is applied may be provided to embody a data processing system, for example, RAID (Redundant Array of Independent Disks) system. The RAID system may include the plurality of SSDs 6300 and a RAID controller for controlling the plurality of SSDs 6300. When the RAID controller performs a program operation in response to a write command provided from the host 6310, the RAID controller may select one or more memory systems or SSDs 6300 according to a plurality of RAID levels, that is, RAID level information of the write command provided from the host 6310 in the SSDs 6300, to output data corresponding to the write command to the selected SSDs 6300. Furthermore, when the RAID controller performs a read command in response to a read command provided from the host 6310, the RAID controller may select one or more memory systems or SSDs 6300 according to a plurality of RAID levels, that is, RAID level information of the read command provided from the host 6310 in the SSDs 6300, to output data read from the selected SSDs 6300 to the host 6310.

Figure 14:
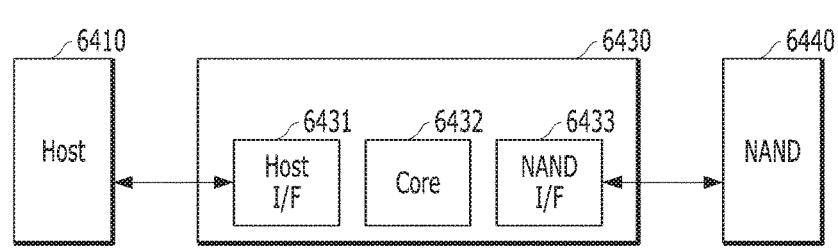

FIG. 14 is a diagram schematically illustrating another example of the data processing system including the memory system in accordance with the present embodiment. Specifically, FIG. 14 schematically illustrates an embedded Multi-Media Card (eMMC) to which the memory system in accordance with the present embodiment is applied.

Referring to FIG. 14 the eMMC 6400 may include a controller 6430 and a memory device 6440 embodied by one or more NAND flash memories. The controller 6430 may correspond to the controller 130 in the memory system 110 of FIG. 1. The memory device 6440 may correspond to the memory device 150 in the memory system 110 of FIG. 1.

More specifically, the controller 6430 may be connected to the memory device 6440 through a plurality of channels. The controller 6430 may include one or more cores 6432, a host interface 6431 and a memory interface, for example, a NAND interface 6433.

The core 6432 may control overall operations of the eMMC 6400, the host interface 6431 may provide an interface function between the controller 6430 and the host 6410. The NAND interface 6433 may provide an interface function between the memory device 6440 and the controller 6430. By the way of example but not limitation, the host interface 6431 may serve as a parallel interface such as MMC interface as described with reference to FIG. 1. Furthermore, the host interface 6431 may serve as a serial interface, for example, UHS ((Ultra High Speed)-I/UHS-II) interface.

FIGS. 15 to 18 are diagrams schematically illustrating other examples of the data processing system including the memory system in accordance with the present embodiment. Specifically, FIGS. 15 to 18 schematically illustrate universal flash storage (UFS) systems to which the memory system in accordance with the present embodiment is applied.

Referring to FIGS. 15 to 18, the UFS systems 6500, 6600, 6700, 6800 may include hosts 6510, 6610, 6710, 6810, UFS devices 6520, 6620, 6720, 6820 and UFS cards 6530, 6630, 6730, 6830, respectively. The hosts 6510, 6610, 6710, 6810 may serve as application processors of wired/wireless electronic devices including mobile electronic devices, the UFS devices 6520, 6620, 6720, 6820 may serve as embedded UFS devices, and the UFS cards 6530, 6630, 6730, 6830 may serve as external embedded UFS devices or removable UFS cards.

The hosts 6510, 6610, 6710, 6810, the UFS devices 6520, 6620, 6720, 6820 and the UFS cards 6530, 6630, 6730, 6830 in the respective UFS systems 6500, 6600, 6700, 6800 may communicate with external devices, for example, wired/wireless electronic devices or specific mobile electronic devices through UFS protocols, and the UFS devices 6520, 6620, 6720, 6820 and the UFS cards 6530, 6630, 6730, 6830 may be embodied by the memory system 110 illustrated in FIG. 1. For example, in the UFS systems 6500, 6600, 6700,

6800, the UFS devices 6520, 6620, 6720, 6820 may be embodied in the form of the data processing system 6200, the SSD 6300 or the eMMC 6400 described with reference to FIGS. 12 to 14, and the UFS cards 6530, 6630, 6730, 6830 may be embodied in the form of the memory card system 6100 described with reference to FIG. 11.

Furthermore, in the UFS systems 6500, 6600, 6700, 6800, the hosts 6510, 6610, 6710, 6810, the UFS devices 6520, 6620, 6720, 6820 and the UFS cards 6530, 6630, 6730, 6830 may communicate with each other through an UFS interface, for example, MIPI M-PHY and MIPI UniPro (Unified Protocol) in MIPI (Mobile Industry Processor Interface). Furthermore, the UFS devices 6520, 6620, 6720, 6820 and the UFS cards 6530, 6630, 6730, 6830 may communicate with each other under various protocols other than the UFS protocol, for example, an UFDs, a MMC, a SD, a mini-SD, and a micro-SD.

Figure 15:
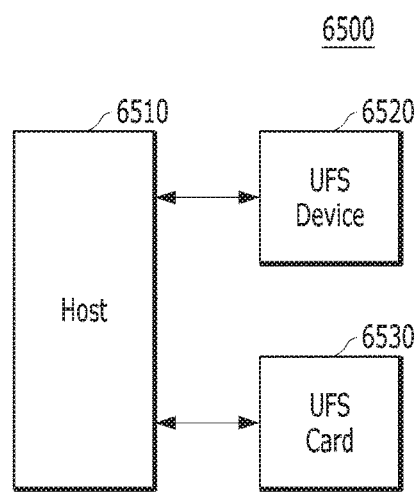

In the UFS system 6500 illustrated in FIG. 15, each of the host 6510, the UFS device 6520 and the UFS card 6530 may include UniPro. The host 6510 may perform a switching operation to communicate with the UFS device 6520 and the UFS card 6530. In particular, the host 6510 may communicate with the UFS device 6520 or the UFS card 6530 through link layer switching, for example, L3 switching at the UniPro. The UFS device 6520 and the UFS card 6530 may communicate with each other through link layer switching at the UniPro of the host 6510. In the present embodiment, the configuration in which one UFS device 6520 and one UFS card 6530 are connected to the host 6510 is described by way of example. However, a plurality of UFS devices and UFS cards may be connected in parallel or in the form of a star to the host 6410. Here, the form of a star is a sort of arrangement where a single device is coupled with plural devices for centralized operation. A plurality of UFS cards may be connected in parallel or in the form of a star to the UFS device 6520 or connected in series or in the form of a chain to the UFS device 6520.

Figure 16:
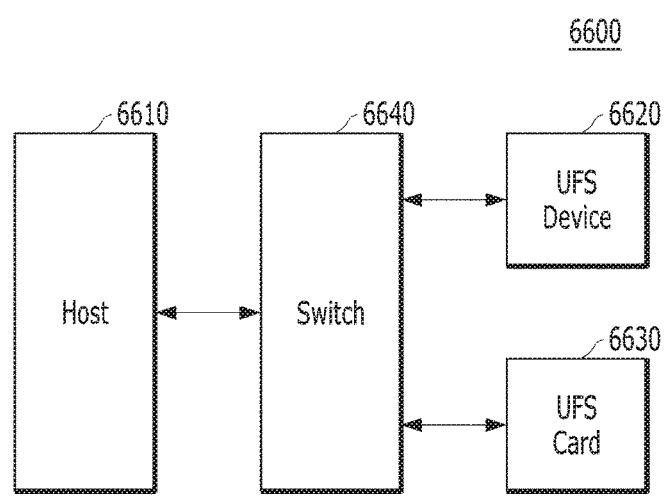

In the UFS system 6600 illustrated in FIG. 16, each of the host 6610, the UFS device 6620 and the UFS card 6630 may include UniPro, and the host 6610 may communicate with the UFS device 6620 or the UFS card 6630 through a switching module 6640 performing a switching operation, for example, through the switching module 6640 which performs link layer switching at the UniPro, for example, L3 switching. The UFS device 6620 and the UFS card 6630 may communicate with each other through link layer switching of the switching module 6640 at UniPro. In the present embodiment, the configuration in which one UFS device 6620 and one UFS card 6630 are connected to the switching module 6640 is described by way of example. However, a plurality of UFS devices and UFS cards may be connected in parallel or in the form of a star to the switching module 6640. A plurality of UFS cards may be connected in series or in the form of a chain to the UFS device 6620.

Figure 17:
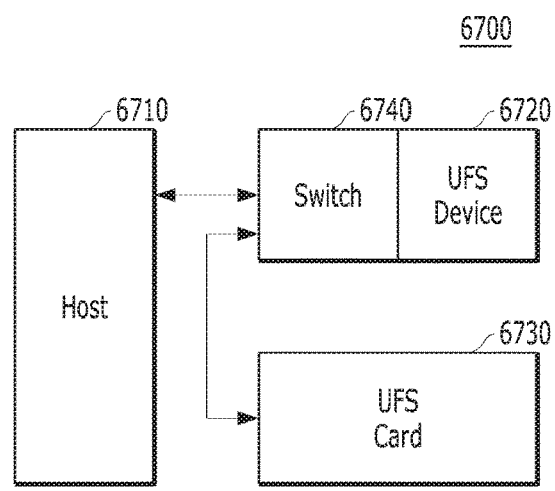

In the UFS system 6700 illustrated in FIG. 17, each of the host 6710, the UFS device 6720 and the UFS card 6730 may include UniPro, and the host 6710 may communicate with the UFS device 6720 or the UFS card 6730 through a switching module 6740 performing a switching operation, for example, through the switching module 6740 which performs link layer switching at the UniPro, for example, L3 switching. The UFS device 6720 and the UFS card 6730 may communicate with each other through link layer switching of the switching module 6740 at the UniPro. The switching module 6740 may be integrated as one module with the UFS device 6720 inside or outside the UFS device 6720. In the present embodiment, the configuration in which one UFS device 6720 and one UFS card 6730 are connected to the switching module 6740 is described by way of example. However, a plurality of modules each including the switching module 6740 and the UFS device 6720 may be connected in parallel or in the form of a star to the host 6710 or connected in series or in the form of a chain to each other. Furthermore, a plurality of UFS cards may be connected in parallel or in the form of a star to the UFS device 6720.

Figure 18:
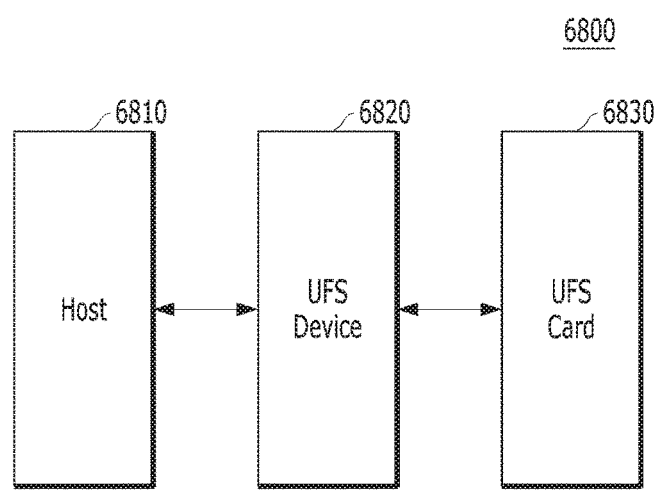

In the UFS system 6800 illustrated in FIG. 18, each of the host 6810, the UFS device 6820 and the UFS card 6830 may include M-PHY and UniPro. The UFS device 6820 may perform a switching operation to communicate with the host 6810 and the UFS card 6830. Particularly, the UFS device 6820 may communicate with the host 6810 or the UFS card 6830 through a switching operation between the M-PHY and UniPro module for communication with the host 6810 and the M-PHY and UniPro module for communication with the UFS card 6830, for example, through a target ID (Identifier) switching operation. The host 6810 and the UFS card 6830 may communicate with each other through target ID switching between the M-PHY and UniPro modules of the UFS device 6820. In the present embodiment, the configuration in which one UFS device 6820 is connected to the host 6810 and one UFS card 6830 is connected to the UFS device 6820 is described by way of example. However, a plurality of UFS devices may be connected in parallel or in the form of a star to the host 6810, or connected in series or in the form of a chain to the host 6810. A plurality of UFS cards may be connected in parallel or in the form of a star to the UFS device 6820, or connected in series or in the form of a chain to the UFS device 6820.

Figure 19:
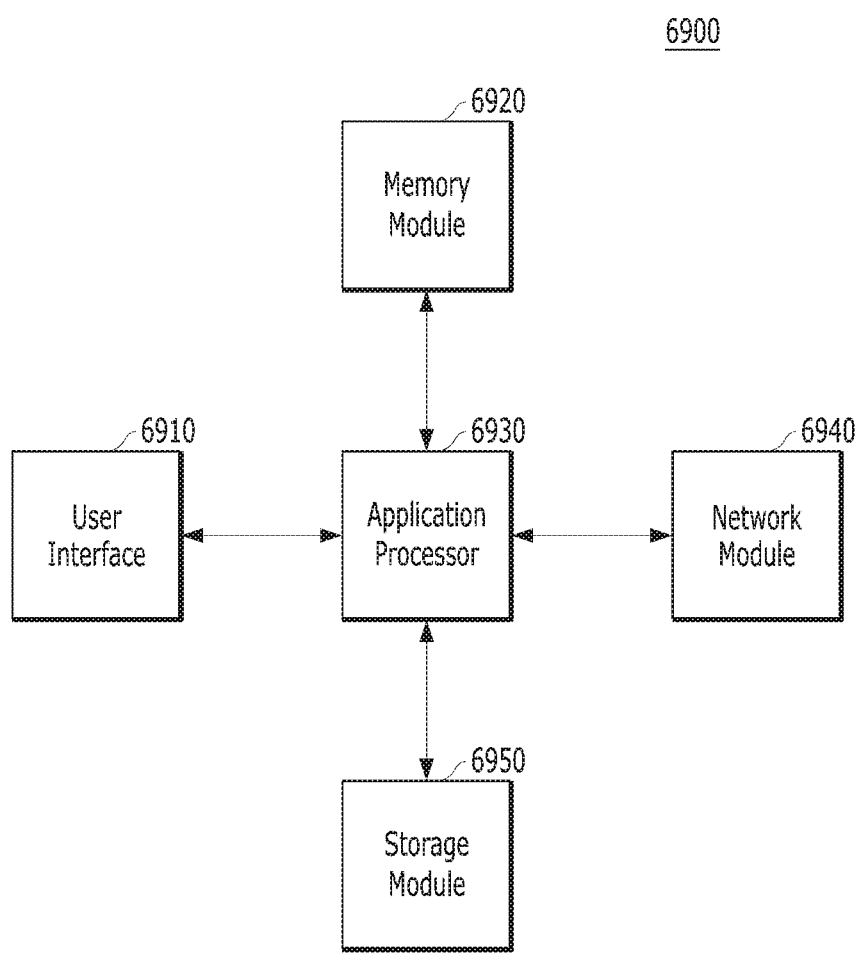

FIG. 19 is a diagram schematically illustrating another example of the data processing system including the memory system in accordance with an embodiment of the present invention, and more particularly illustrating a user system to which the memory system in accordance with the present embodiment is applied.

Referring to FIG. 19, the user system 6900 may include an application processor 6930, a memory module 6920, a network module 6940, a storage module 6950 and a user interface 6910.

More specifically, the application processor 6930 may drive components included in the user system 6900, for example, an OS, and include controllers, interfaces and a graphic engine which control the components included in the user system 6900. The application processor 6930 may be provided as System-on-Chip (SoC).

The memory module 6920 may be used as a main memory, work memory, buffer memory or cache memory of the user system 6900. The memory module 6920 may include a volatile RAM such as a DRAM, a SDRAM, a DDR SDRAM, a DDR2 SDRAM, a DDR3 SDRAM, a LPDDR SDARM, a LPDDR3 SDRAM or a LPDDR3 SDRAM or a nonvolatile RAM such as a PRAM, a ReRAM, a MRAM or a FRAM. For example, the application processor 6930 and the memory module 6920 may be packaged and mounted, based on POP (Package on Package).

The network module 6940 may communicate with external devices. For example, the network module 6940 may not only support wired communication, but also support various wireless communication protocols such as code division multiple access (CDMA), global system for mobile communication (GSM), wideband CDMA (WCDMA), CDMA-2000, time division multiple access (TDMA), long term evolution (LTE), worldwide interoperability for microwave access (Wimax), wireless local area network (WLAN), ultra-wideband (UWB), Bluetooth, wireless display (WI- DI), thereby communicating with wired/wireless electronic devices including mobile electronic devices. Therefore, the memory system and the data processing system, in accordance with an embodiment of the present invention, can be applied to wired/wireless electronic devices. The network module 6940 may be included in the application processor 6930.

The storage module 6950 may store data, for example, data received from the application processor 6930, and then may transmit the stored data to the application processor 6930. The storage module 6950 may be embodied by a nonvolatile semiconductor memory device such as a phase-change RAM (PRAM), a magnetic RAM (MRAM), a resistive RAM (ReRAM), a NAND flash, a NOR flash and a 3D NAND flash, and provided as a removable storage medium such as a memory card or external drive of the user system 6900. The storage module 6950 may correspond to the memory system 110 described with reference to FIG. 1. Furthermore, the storage module 6950 may be embodied as an SSD, an eMMC and an UFS as described above with reference to FIGS. 13 to 18.

The user interface 6910 may include interfaces for inputting data or commands to the application processor 6930 or outputting data to an external device. For example, the user interface 6910 may include user input interfaces such as a keyboard, a keypad, a button, a touch panel, a touch screen, a touch pad, a touch ball, a camera, a microphone, a gyroscope sensor, a vibration sensor and a piezoelectric element, and user output interfaces such as a liquid crystal display (LCD), an organic light emitting diode (OLED) display device, an active matrix OLED (AMOLED) display device, an LED, a speaker and a motor.

Furthermore, when the memory system 110 of FIG. 1 is applied to a mobile electronic device of the user system 6900, the application processor 6930 may control overall operations of the mobile electronic device, and the network module 6940 may serve as a communication module for controlling wired/wireless communication with an external device. The user interface 6910 may display data processed by the processor 6930 on a display/touch module of the mobile electronic device. The user interface 6910 may support a function of receiving data from the touch panel.

According to embodiments of the invention, as a memory system may resume a write operation so as not to be affected by erase cell disturbance, whereby performance of the memory system is improved.

While the present invention has been described with respect to specific embodiments, it will be apparent to those skilled in the art, in light of the present disclosure, that various changes and modifications may be made without departing from the spirit and scope of the invention as defined in the following claims.

What is claimed is:

1. An operating method of a memory system that includes a plural-level cell memory block capable of storing N-bit data in a single memory cell, comprising:
   accessing a plural-level cell memory block in an N-bit cell mode;
   determining a degree of disturbance of the plural-level cell memory block;
   designating one or more memory cells in an erase state included in an open memory area of the plural-level cell memory block as an M-bit group, where M is an integer smaller than N, according to a result of the determination; and
   accessing the M-bit group in an M-bit cell mode.

2. The operating method of claim 1, the determining of the degree of disturbance of the accessed plural-level cell memory block includes:
   checking whether or not a read count of the memory block exceeds a predetermined threshold value.

3. The operating method of claim 1, wherein the accessing of the M-bit group in the M-bit cell mode includes:
   programming the M-bit group in the M-bit cell mode.

4. The operating method of claim 3, wherein the programming of the M-bit group in the M-bit cell mode includes:
   programming user data in M bits of a plural-level cell.

5. The operating method of claim 4, wherein the programming of the M-bit group in the M-bit cell mode further includes:
   programming dummy data in remaining N-M bits except for the M bits in which the user data is programmed.

6. The operating method of claim 1, wherein the accessing of the M-bit group in the M-bit cell mode includes:
   reading the M-bit group in the M-bit cell mode.

7. The operating method of claim 6, wherein the reading of the M-bit group in the M-bit cell mode includes:
   increasing a read voltage, which distinguishes the erase state and a program state, to read the M-bit group.

8. The operating method of claim 1, wherein the plural-level cell memory block is a multi-level cell memory block, the M-bit group is a single-level cell group, and the M-bit cell mode is a single-level cell mode.

9. The operating method of claim 1, wherein the plural-level cell memory block is a triple-level cell memory block, the M-bit group is a single-level cell group, and the M-bit cell mode is a single-level cell mode.

10. The operating method of claim 1, wherein the plural-level cell memory block is a triple-level cell memory block, the M-bit group is a multi-level cell group, and the M-bit cell mode is a multi-level cell mode.

11. A memory system, comprising:
    a memory device including a plural-level cell memory block capable of storing N-bit data in a single memory cell; and
    a controller suitable for controlling the memory device,
    wherein the controller accesses a plural-level cell memory block in an N-bit cell mode, determines a degree of disturbance of the plural-level cell memory block, designates one or more memory cells in an erase state included in an open memory area of the plural-level cell memory block as an M-bit group, where M is an integer smaller than N, according to a result of the determination, and accesses the M-bit group in an M-bit cell mode (hereinafter referred to as an "M-bit cell mode access").

12. The memory system of claim 11, wherein the controller checks whether or not a read count of the memory block exceeds a predetermined threshold value to determine the degree of disturbance of the accessed plural-level cell memory block.

13. The memory system of claim 11, wherein the M-bit cell mode access includes an M-bit cell mode program operation.

14. The memory system of claim 13, wherein the controller performs the M-bit cell mode program operation by programming user data in M bits of a plural-level cell.

15. The memory system of claim 14, wherein the controller performs the M-bit cell mode program operation by programming dummy data in remaining N-M bits except for the M bits in which the user data is programmed.

16. The memory system of claim 11, wherein the M-bit cell mode access includes an M-bit cell mode read operation.

17. The memory system of claim 16, wherein the controller increases a read voltage, which distinguishes the erase state and a program state, to read the M-bit group during the M-bit cell mode read operation.

18. The memory system of claim 11, wherein the plural-level cell memory block is a multi-level cell memory block, the M-bit group is a single-level cell group, and the M-bit cell mode is a single-level cell mode.

19. The memory system of claim 11, wherein the plural-level cell memory block is a triple-level cell memory block, the M-bit group is a single-level cell group, and the M-bit cell mode is a single-level cell mode.

20. The memory system of claim 11, wherein the plural-level cell memory block is a triple-level cell memory block, the M-bit group is a multi-level cell group, and the M-bit cell mode is a multi-level cell mode.

21. A memory system, comprising:
- a memory device including a plurality of plural-level cell memory blocks, each including a plurality of memory cells, each capable of storing N-bit data; and
- a controller suitable for accessing at least one plural-level cell memory block and monitoring disturbance of accessed plural-level cell memory block,
- wherein, when the disturbance of the accessed plural-level cell memory block exceeds a threshold value, the controller handles an unprogrammed region of the accessed plural-level cell memory block in a way that one or more memory cells in the unprogrammed region are capable of storing M-bit data, where M is a smaller integer than N.

* * * * *